US012509763B2

(12) United States Patent
Kobayashi et al.

(10) Patent No.: US 12,509,763 B2
(45) Date of Patent: Dec. 30, 2025

(54) NOBLE METAL VAPOR DEPOSITION MATERIAL

(71) Applicant: MATSUDA SANGYO COMPANY LIMITED, Tokyo (JP)

(72) Inventors: Takahiro Kobayashi, Saitama (JP); Atsushi Kawashimo, Saitama (JP)

(73) Assignee: MATSUDA SANGYO COMPANY LIMITED, Tokyo (JP)

( * ) Notice: Subject to any disclaimer, the term of this patent is extended or adjusted under 35 U.S.C. 154(b) by 0 days.

(21) Appl. No.: 18/841,124

(22) PCT Filed: Dec. 1, 2023

(86) PCT No.: PCT/JP2023/043066
§ 371 (c)(1),
(2) Date: Aug. 23, 2024

(87) PCT Pub. No.: WO2024/190000
PCT Pub. Date: Sep. 19, 2024

(65) Prior Publication Data
US 2025/0115990 A1 Apr. 10, 2025

(30) Foreign Application Priority Data
Mar. 13, 2023 (JP) ................................ 2023-038422

(51) Int. Cl.
*C23C 16/06* (2006.01)
*C23C 16/44* (2006.01)

(52) U.S. Cl.
CPC .............. *C23C 16/06* (2013.01); *C23C 16/44* (2013.01)

(58) Field of Classification Search
CPC .......... C23C 16/06; C23C 16/44; C23C 14/24
See application file for complete search history.

(56) References Cited

FOREIGN PATENT DOCUMENTS

| | | | | |
|---|---|---|---|---|
| JP | H01-180961 | A | | 7/1989 |
| JP | H01-180962 | A | | 7/1989 |
| JP | H06-112259 | A | | 4/1994 |
| JP | H06-279992 | A | | 10/1994 |
| JP | 2002275561 | A | * | 9/2002 |
| JP | 2018-123389 | A | | 8/2018 |
| JP | 2021-021109 | A | | 2/2021 |
| JP | 2021-091922 | A | | 6/2021 |
| JP | 2022-059295 | A | | 4/2022 |
| JP | 2022-059296 | A | | 4/2022 |
| WO | 2022/070432 | A1 | | 4/2022 |
| WO | 2022/070433 | A1 | | 4/2022 |

OTHER PUBLICATIONS

JP-2002275561-A English translation. (Year: 2002).*
International Search Report issued for corresponding PCT International Application No. PCT/JP2023/043066 on Feb. 20, 2024.
Office Action dated Jul. 4, 2023 issued in corresponding JP Patent Application No. 2023-038422.
Office Action dated Oct. 24, 2023 issued in corresponding JP Patent Application No. 2023-038422.
Office Action dated Feb. 13, 2024 issued in corresponding JP Patent Application No. 2023-038422.

* cited by examiner

*Primary Examiner* — Hai Y Zhang
(74) *Attorney, Agent, or Firm* — Howson & Howson LLP

(57) ABSTRACT

An object of the present disclosure is to provide a noble metal vapor deposition material for use in a vacuum vapor deposition method capable of suppressing the occurrence of the bumping phenomenon during vacuum vapor deposition. Provided is a vapor deposition material composed of a noble metal, wherein, when a surface area of 50 μm×50 μm of the vapor deposition material is analyzed using energy dispersive X-ray spectroscopy, Fe is less than 10 wt %, and when analysis is performed using ICP atomic emission spectroscopy, Fe is 10 wtppm or less.

1 Claim, No Drawings

NOBLE METAL VAPOR DEPOSITION MATERIAL

TECHNICAL FIELD

The present disclosure relates to a noble metal vapor deposition material for use in a vacuum vapor deposition method.

BACKGROUND ART

The vacuum vapor deposition method is one type of deposition technique, and is a technique in which a thin film is formed by heating a vapor deposition material in a vacuum, and the vapor deposition material that becomes gas molecules adhering to a substrate. The vacuum vapor deposition method is broadly used for the formation of elements in electronic components, semiconductor devices, optical thin films, magnetic devices, LEDs, organic ELs, and LCDs.

When a vapor deposition material is filled in a crucible and melted using an electron beam or the like, there was a problem in that the bumping phenomenon would occur and molten droplets would adhere to the thin film. To deal with this problem, Patent Document 1 discloses a technique to prevent bumping by reducing the impurities contained in the vapor deposition material. Moreover, Patent Document 2 describes that the adherence of molten droplets can be prevented by washing the surface of the vapor deposition material with aqua regia.

The applicant has previously disclosed a technique capable of suppressing the bumping phenomenon during vacuum vapor deposition by using a gold vapor deposition material for use in the vacuum vapor deposition method. For example, Patent Document 3 discloses a vapor deposition material having a surface roughness Ra or 10 μm or less, and in which the number of microcracks having an equivalent area diameter of 0.1 mm or more has been reduced, and Patent Document 4 discloses a vapor deposition material having an average crystal grain size of 0.1 mm or more, an oxygen content of 10 wtppm or less, and a hydrogen content of 5 wtppm or less.

PRIOR ART DOCUMENTS

Patent Documents

[Patent Document 1] Japanese Unexamined Patent Application Publication No. H1-180961

[Patent Document 2] Japanese Unexamined Patent Application Publication No. 2018-123389

[Patent Document 3] International Publication No. 2022/070432

[Patent Document 4] International Publication No. 2022/070433

SUMMARY OF THE INVENTION

Problems to Solved by the Invention

An object of the present disclosure is to provide a noble metal vapor deposition material for use in a vacuum vapor deposition method capable of suppressing the occurrence of the bumping phenomenon during vacuum vapor deposition.

Means for Solving the Problems

An overview of the present disclosure is as follows.

[1]

A vapor deposition material composed of a noble metal, wherein, when a surface area of 50 μm×50 μm of the vapor deposition material is analyzed using energy dispersive X-ray spectroscopy, Fe is less than 10 wt %, and when analysis is performed using ICP atomic emission spectroscopy, Fe is 10 wtppm or less.

[2]

A vapor deposition material composed of a noble metal, wherein, when a surface area of 50 μm×50 μm of the vapor deposition material is analyzed using energy dispersive X-ray spectroscopy, Si is less than 10 wt %, and when analysis is performed using ICP atomic emission spectroscopy, Si is 10 wtppm or less.

[3]

A vapor deposition material composed of a noble metal, wherein, when a surface area of 50 μm×50 μm of the vapor deposition material is analyzed using energy dispersive X-ray spectroscopy, C is 10 wt % or less, and when analysis is performed using non-dispersive infrared, C is 10 wtppm or less.

Effect of the Invention

According to the present disclosure, the bumping phenomenon can be effectively suppressed when melting a noble metal vapor deposition material. Consequently, the reduction of particles that adhere to the substrate can be expected, and this can contribute to the improvement in the product yield.

BEST MODE FOR CARRYING OUT THE INVENTION

As a noble metal vapor deposition material for use in a vacuum vapor deposition method, a noble metal raw material having a purity of 99.9 wt % or higher is normally used as the raw material, and the noble metal raw material is subject to atmospheric melting in a ceramic crucible made from alumina or in a carbon crucible. After melting, the molten metal of the noble metal is poured into a mold to prepare an ingot, the obtained ingot is drawn (wire drawing process) using lubricating oil, and thereafter cut to a predetermined length to prepare a pellet (rod shape). The pellet surface is then washed with acid or an organic solvent to remove the impurities that adhered to the surface. As a result of going through the processes described above, a pellet-shaped noble metal vapor deposition material with relatively few impurities can be prepared.

Nevertheless, even when this kind of noble metal vapor deposition material with relatively few impurities is used, there was a problem in that a bumping phenomenon occurs in the early stage of vapor deposition, causing the production efficiency to deteriorate as a result of the preliminary vapor deposition performed before the actual vapor deposition taking longer, or the condition setting of the deposition equipment having to changed. In particular, because a noble metal is extremely expensive as a material, there was a problem in that the longer the preliminary vapor deposition time, the higher the cost. There was also a problem in that bumping contaminates the inside of the equipment and crucible, causing the frequency of washing the equipment to increase.

As a result of analyzing the surface and inside of the vapor deposition material, the present inventors and others discovered that many iron-based components (iron or its compounds), silicon-based components (silicon or its compounds), and carbon-based components (carbon or its compounds) exist on the surface and inside the vapor deposition material and that, when a large amount of these components (hereinafter sometimes referred to as "impurity components") exist, the bumping phenomenon increases with these impurity components as the origin. The present inventors and others consequently discovered that the bumping phenomenon during vacuum vapor deposition can be suppressed by reducing these impurity components.

In the present disclosure, the abundance of impurity components on the surface of the vapor deposition material is represented by the result of performing surface analysis using energy dispersive X-ray spectroscopy, and the abundance of impurity components inside the vapor deposition material is represented by the result of performing analysis using ICP atomic emission spectroscopy or non-dispersive infrared. Moreover, in the present disclosure, because the surface analysis using energy dispersive X-ray spectroscopy varies considerably from sample to sample, 10 samples were randomly selected, the center part of each sample was measured, and the average value of the 10 samples was used as the abundance of impurity components on the surface of the vapor deposition material.

An embodiment of the present disclosure is a vapor deposition material composed of a noble metal, wherein, when a surface area of 50 μm×50 μm of the vapor deposition material is analyzed using energy dispersive X-ray spectroscopy, Fe is less than 10 wt %, and when analysis is performed using ICP atomic emission spectroscopy, Fe is 10 wtppm or less. Iron-based components are compounds and iron oxides having iron (Fe) as their main component, and are included in the raw material used or get mixed in from the equipment parts used during the wire drawing process.

By reducing Fe to less than 10 wt % on the surface of the noble metal vapor deposition material and to 10 wtppm or less inside the noble metal vapor deposition material, the bumping phenomenon during vapor deposition can be effectively suppressed. Fe on the surface of the noble metal vapor deposition material is preferably 5 wt % or less, and more preferably 1 wt % or less. Moreover, Fe inside the noble metal vapor deposition material is preferably 5 wtppm or less, and more preferably 1 wtppm or less.

An embodiment of the present disclosure is a vapor deposition material composed of a noble metal, wherein, when a surface area of 50 μm×50 μm of the vapor deposition material is analyzed using energy dispersive X-ray spectroscopy, Si is less than 10 wt %, and when analysis is performed using an ICP optical emission spectrometer, Si is 10 wtppm or less. Silicon-based components are compounds and silicon oxides having silicon (Si) as their main component, and are not only included in the raw material used, but also get mixed in from the ambient atmosphere (air) or the crucible used during the melting process.

By reducing Si to less than 10 wt % on the surface of the noble metal vapor deposition material and to 10 wtppm or less inside the noble metal vapor deposition material, the bumping phenomenon during vapor deposition can be effectively suppressed. Si on the surface of the noble metal vapor deposition material is preferably 5 wt % or less, and more preferably 1 wt % or less. Moreover, Si inside the noble metal vapor deposition material is preferably 5 wtppm or less, and more preferably 1 wtppm or less.

An embodiment of the present disclosure is a vapor deposition material composed of a noble metal, wherein, when a surface area of 50 μm×50 μm of the vapor deposition material is analyzed using energy dispersive X-ray spectroscopy, C is 10 wt % or less, and when analysis is performed using non-dispersive infrared, C is 10 wtppm or less. Carbon-based components are compounds having carbon (C) as their main component that get mixed in when using a carbon crucible or mold, or get mixed in from the lubricating oil used during the wire drawing process.

By reducing C to 10 wt % or less on the surface of the noble metal vapor deposition material and to 10 wtppm or less inside the noble metal vapor deposition material, the bumping phenomenon during vapor deposition can be effectively suppressed. C on the surface of the noble metal vapor deposition material is preferably 5 wt % or less, and more preferably 1 wt % or less.

With the vapor deposition material according to the embodiments of the present disclosure, in the least one type among Fe, Si, and C may be within the foregoing range, more preferably two types among Fe, Si, and C may be within the foregoing range, and most preferably Fe, Si, and C are all within the foregoing range. Because a large amount of these impurities existing on the surface of the vapor deposition material will cause the bumping phenomenon, the source of contamination is not particularly important.

In the present disclosure, the vapor deposition material is composed of one type of noble metal among gold (Au), platinum (Pt), palladium (Pd), and silver (Ag). Normally, a high purity product having a purity of 99.9 wt % or higher or 99.99 wt % or higher may be used. Because impurities are one cause of the bumping phenomenon, the bumping phenomenon can be suppressed to a certain degree by using a high purity product. Nevertheless, since high purity products are expensive, they may be changed as appropriate depending on the usage or purpose.

The manufacturing method of the vapor deposition material according to this embodiment is now explained in detail. Note that the manufacturing conditions are merely examples, and there is no intention of limiting the manufacturing method to these conditions. Moreover, in order to prevent the disclosed manufacturing method from becoming unnecessarily unclear, the explanation of well-known manufacturing processes and processing operations will be omitted.

Casting Process

A noble metal raw material having a purity of 99.9 wt % or higher is subject to EB (electron beam) melting, skull melting or the like. While a ceramic crucible or a carbon crucible is used for the casting of general noble metals, because impurity components get mixed in when these crucibles are used, it is preferable to perform EB melting using a copper crucible with less contamination, or perform skull melting with less contamination from the crucible. The melting temperature is preferably set to a temperature that is 50° C. or higher and 200° C. or less from the melting point of the target noble metal. After melting the noble metal raw material in a vacuum or in an atmosphere containing an inert gas (vacuum: 1000 to 0.001 Pa), the molten metal is poured into a water cooled copper mold, and thereafter cooled at room temperature to prepare a noble metal ingot (cast product). While contamination from the crucible and mold can be prevented with this process method, impurity components derived from the raw material will remain.

Forging Process, Rolling Process

Forging and rolling are performed to obtain a predetermined shape that can be processed in the subsequent wire drawing process. In this process, while there is a risk of impurity components getting mixed in from equipment parts, by performing forging and rolling while heating the ingot at a temperature range of 300° C. or higher to a temperature that is lower than the melting point of the target noble metal by 100° C. or more, the impurity components derived from the raw material or those mixed in from the equipment parts can be condensed on the surface. The heating temperature is preferably 300° C. or higher. Meanwhile, because a part of the noble metal will melt when heating is performed at a temperature exceeding the melting point of the target noble metal, it is preferable to heat the ingot at a temperature that is lower than the melting point of the target noble metal by 100° C. or more. While impurity components may adhere to the surface from the equipment parts or surroundings during the forging and rolling processes, by heating the ingot at a predetermined temperature when performing these processes, such impurity components can be condensed on the surface of the noble metal.

Wire Drawing Process, Cutting

The obtained noble metal (forged product or rolled product) is drawn (wire drawing process) into a wire shape. Impurity components are condensed on the surface from the inside before and after this wire drawing process, or during the wire drawing process. The optimal range of the heat treatment temperature will differ depending on the type of vapor deposition material, and it is preferable to adjust the heat treatment temperature in the following manner.

- Heat treatment temperature of gold (Au): 300° C. or higher, 900° C. or less
- Heat treatment temperature of platinum (Pt): 500° C. or higher, 1500° C. or less
- Heat treatment temperature of palladium (Pd): 300° C. or higher, 1000° C. or less
- Heat treatment temperature of silver (Ag): 300° C. or higher, 800° C. or less While impurity components may adhere to the surface from the equipment or ambient atmosphere due to the wire drawing process, because hardly any impurity components will exist internally, these components can be removed by performing the pickling process described later. Note that, normally, lubricating oil is used during the wire drawing process, but the use of lubricating oil is preferably avoided as it can cause contamination from carbon-based components. After the wire drawing process, the wire is cut to a predetermined length. There is no particular limitation in the length that the wire should be cut as it will differ depending on the equipment, and, for instance, the length of the wire may be 10 mm or more, 20 mm or more, or 30 mm or more.

Pickling, Washing Process

After cutting, the impurity components condensed on the surface of the noble metal (vapor deposition material) can be removed by pickling and washing the surface. Examples of solutions to be used for the acid include aqua regia and hydrochloric acid. The noble metal is thereafter washed with acetone and pure water. The intended noble metal vapor deposition material (rod shape) can be prepared based on the processes described above.

EXAMPLES

The present invention is now explained based on the following Examples and Comparative Examples. Note that the following Examples are merely representative examples, and the present invention does not need to limited to these Examples, and should be interpreted pursuant to the scope of its technical concept described herein.

The Examples and Comparative Examples were analyzed using the following device and conditions.

Surface Analysis Using Energy Dispersive X-Ray Spectroscopy

- Analyzer: Aztec Advanced UltimMax 40 manufactured by Oxford
- Acceleration voltage: 10 KV or 15 KV
- Magnification: 200 to 20,000×
- Irradiation current: 7 to 10 μA
- Objective aperture: 3
- Analyzed area: 100 μm×100 μm
- Working distance (WD): 10 mm
- Detector: Secondary electrons
- Resolution: 127 eV
- Measurement method: A sample having a diameter or 2 mm and a length of 20 mm was prepared. Because the surface analysis varies considerably from sample to sample, 10 samples were randomly selected, the center part of each sample was measured, and the average value was obtained from the measured values of the 10 samples.

Analysis Using ICP Atomic Emission Spectroscopy

- Analyzer: ICP-OES, SPECTROGREEN FMD46 manufactured by AMETEK
- Sample: Approximately 2 g was extracted from the vapor deposition material, dissolved in aqua regia, filtered, and then adjusted to a constant volume.

Analysis Using Non-Dispersive Infrared

- Analyzer: Carbon/Sulfur Analyzer EMIA-920V manufactured by HORIBA
- Combustion improver: W 1.5 g, Sn 3.5 g Evaluation of Bumping Phenomenon If a bumping phenomenon occurs during the electron beam melting of a vapor deposition material, the vapor deposition material adheres to the inside of the deposition equipment and the weight of the vapor deposition material will decrease. Therefore, the bumping phenomenon can be evaluated by measuring the weight loss of the vapor deposition material after melting. Approximately 40 g of the vapor deposition material is placed in a copper crucible, subject to electron beam melting under the following conditions; specifically, vacuum of $1\times10^{-1}$ Pa, electron beam irradiation power of 6 KW, and electron beam irradiation time of 2 minutes, and the weight loss after melting is measured. Note that, with these melting conditions, there is hardly any loss caused by evaporation. A weight loss ratio of less than 0.01 wt % was evaluated as ◎ (very good), a weight loss ratio of 0.01 or more and less than 0.1 wt % was evaluated as ○ (good), a weight loss ratio of 0.1 or more and less than 1 wt % was evaluated as Δ (bad), and a weight loss ratio of 1 wt % or higher was evaluated as × (very bad).

Example 1: Au Vapor Deposition Material

A Au raw material having a purity of 99.99 wt % or higher was subject to electron beam melting in a water cooled copper crucible at a vacuum of 10 Pa to prepare an ingot. The obtained ingot was forged and rolled at 300° C. into a 50 mm-square ingot. The ingot was thereafter subject to wire drawing while being heat treated at 500° C. No lubricating oil was used during the wire drawing process, and the obtained wire was thinned to have a diameter of roughly 2 mm. After the wire drawing process, the wire was cut to a length of 20 mm, the surface thereof was pickled with aqua regia, and thereafter washed with acetone and then dried.

The surface of the drawn sample was observed with an SEM (JSM-7000E, manufactured by JEOL Ltd.: Magnification of 100×), and then analyzed using energy dispersive X-ray spectroscopy. As a result, Fe, Si, and C were all less than 10 wt %. Moreover, as a result of analyzing the sample using ICP atomic emission spectroscopy, Fe, and Si were less than 1 wtppm. As a result of analyzing the sample using non-dispersive infrared, C was less than 10 wtppm. As a result of evaluating the bumping phenomenon of the obtained sample, the weight loss ratio was very good at less than 0.01%.

Comparative Example 1: Au Vapor Deposition Material

A Au raw material having a purity of 99.99 wt % or higher was subject to atmospheric melting in a carbon crucible to prepare an ingot. The obtained ingot was forged and rolled into a 50 mm-square ingot. The ingot was thereafter subject to wire drawing without being heat treated. No lubricating oil was used during the wire drawing process, and the obtained wire was thinned. After the wire drawing process, the wire was cut to a length of 20 mm, the surface thereof was pickled with aqua regia, and the surface was thereafter washed with acetone and then dried.

The surface of the drawn sample was analyzed using energy dispersive X-ray spectroscopy in the same manner as Example 1. As a result, Fe, Si, and C were all 10 wt % or higher. Moreover, as a result of analyzing the sample using ICP atomic emission spectroscopy, Fe, and Si were respectively 18 wtppm, and 12 wtppm. As a result of analyzing the sample using a non-dispersive infrared device, C was 30 wtppm. As a result of evaluating the bumping phenomenon of the obtained sample, the weight loss ratio was bad at 0.2 wt %.

Example 2: Pt Vapor Deposition Material

A Pt raw material having a purity of 99.95 wt % or higher was subject to skull melting in a water cooled copper crucible at a vacuum of 0.1 Pa to prepare an ingot. The obtained ingot was forged and rolled at 900° C. into a 50 mm-square ingot. The ingot was thereafter subject to wire drawing while being heat treated at 800° C. No lubricating oil was used during the wire drawing process, and the obtained wire was thinned to have a diameter of roughly 2 mm. After the wire drawing process, the wire was cut to a length of 20 mm, the surface thereof was pickled with aqua regia, and thereafter washed with acetone and then dried.

The surface of the drawn sample was analyzed using energy dispersive X-ray spectroscopy in the same manner as Example 1. As a result, Fe, Si, and C were all 10 wt % or less. Moreover, as a result of analyzing the sample using ICP atomic emission spectroscopy, Fe, and Si were respectively 3 wtppm, and 2 wtppm. As a result of analyzing the sample using non-dispersive infrared, C was less than 10 wtppm. As a result of evaluating the bumping phenomenon of the obtained sample, the weight loss ratio was good at 0.02%.

Comparative Example 2: Pt Vapor Deposition Material

A Pt raw material having a purity of 99.95 wt % was subject to atmospheric melting in a ceramic crucible to prepare an ingot. The obtained ingot was forged and rolled into a 50 mm-square ingot. The ingot was thereafter subject to wire drawing without being heat treated. No lubricating oil was used during the wire drawing process, and the obtained wire was thinned. After the wire drawing process, the wire was cut to a length of 20 mm, the surface thereof was pickled with aqua regia, and the surface was thereafter washed with acetone and then dried.

The surface of the drawn sample was analyzed using energy dispersive X-ray spectroscopy in the same manner as Example 1. As a result, Fe, Si, and C were all 10 wt % or higher. Moreover, as a result of analyzing the sample using ICP atomic emission spectroscopy, Fe, and Si were respectively 15 wtppm, and 20 wtppm. As a result of analyzing the sample using a non-dispersive infrared device, C was 20 wtppm. As a result of evaluating the bumping phenomenon of the obtained sample, the weight loss ratio was very bad at 1.5 wt %.

Example 3: Pd Vapor Deposition Material

A Pd raw material having a purity of 99.9 wt % or higher was subject to skull melting in a water cooled copper crucible at a vacuum of 500 Pa, with argon introduced therein, to prepare an ingot. The obtained ingot was forged and rolled at 1000° C. into a 50 mm-square ingot. The ingot was thereafter subject to wire drawing while being heat treated at 600° C. No lubricating oil was used during the wire drawing process, and the obtained wire was thinned to have a diameter of roughly 2 mm. After the wire drawing process, the wire was cut to a length of 20 mm, the surface thereof was pickled with aqua regia, and thereafter washed with acetone and then dried.

The surface of the drawn sample was analyzed using energy dispersive X-ray spectroscopy in the same manner as Example 1. As a result, Fe, and Si were both less than 10 wt %, and C was 10 wt %. Moreover, as a result of analyzing the sample using ICP atomic emission spectroscopy, Fe, and Si were respectively 5 wtppm, and 8 wtppm. As a result of analyzing the sample using non-dispersive infrared, C was 10 wtppm. As a result of evaluating the bumping phenomenon of the obtained sample, the weight loss ratio was good at 0.09%.

Comparative Example 3: Pd Vapor Deposition Material

A Pd raw material having a purity of 99.9 wt % or higher was subject to atmospheric melting in a ceramic crucible to prepare an ingot. The obtained ingot was forged and rolled into a 50 mm-square ingot. The ingot was thereafter subject to wire drawing without being heat treated. No lubricating oil was used during the wire drawing process, and the obtained wire was thinned. After the wire drawing process, the wire was cut to a length of 20 mm, the surface thereof was pickled with aqua regia, and the surface was thereafter washed with acetone and then dried.

The surface of the drawn sample was analyzed using energy dispersive X-ray spectroscopy in the same manner as Example 1. As a result, Fe, Si, and C were all 10 wt % or higher. Moreover, as a result of analyzing the sample using ICP atomic emission spectroscopy, Fe, and Si were respectively 30 wtppm, and 45 wtppm. As a result of analyzing the sample using a non-dispersive infrared device, C was 20 wtppm. As a result of evaluating the bumping phenomenon of the obtained sample, the weight loss ratio was very bad at 2.7 wt %.

Example 4: Ag Vapor Deposition Material

A Ag raw material having a purity of 99.99 wt % or higher was subject to electron beam melting in a water cooled copper crucible at a vacuum of 10 Pa to prepare an ingot. The obtained ingot was forged and rolled at 500° C. into a 50 mm-square ingot. The ingot was thereafter subject to wire drawing while being heat treated at 300° C. No lubricating oil was used during the wire drawing process, and the obtained wire was thinned to have a diameter of roughly 2 mm. After the wire drawing process, the wire was cut to a length of 20 mm, the surface thereof was pickled with aqua regia, and thereafter washed with acetone and then dried.

The surface of the drawn sample was analyzed using energy dispersive X-ray spectroscopy in the same manner as Example 1. As a result, Fe, Si, and C were all less than 10 wt %. Moreover, as a result of analyzing the sample using ICP atomic emission spectroscopy, Fe, and Si were both less than 1 wtppm. As a result of analyzing the sample using non-dispersive infrared, C was less than 10 wtppm. As a result of evaluating the bumping phenomenon of the obtained sample, the weight loss ratio was very good at less than 0.01%.

Comparative Example 4

A Ag raw material having a purity of 99.99 wt % or higher was subject to atmospheric melting in a carbon crucible to prepare an ingot. The obtained ingot was forged and rolled into a 50 mm-square ingot. The ingot was thereafter subject to wire drawing without being heat treated. No lubricating oil was used during the wire drawing process, and the obtained wire was thinned. After the wire drawing process, the wire was cut to a length of 20 mm, the surface thereof was pickled with aqua regia, and the surface was thereafter washed with acetone and then dried.

The surface of the drawn sample was analyzed using energy dispersive X-ray spectroscopy in the same manner as Example 1. As a result, Fe, Si, and C were all 10 wt % or higher. Moreover, as a result of analyzing the sample using ICP atomic emission spectroscopy, Fe, and Si were respectively 12 wtppm, and 15 wtppm. As a result of analyzing the sample using a non-dispersive infrared device, C was 50 wtppm. As a result of evaluating the bumping phenomenon of the obtained sample, the weight loss ratio was bad at 0.5 wt %.

TABLE 1

| | Vapor deposition material | Manufacturing process: Raw material wt % | Manufacturing process: Melting Type of crucible | Manufacturing process: Forging and rolling Heating temperature | Manufacturing process: Drawing Heat treatment temperature | Surface analysis (average value) (wt %): Fe | Surface analysis: Si | Surface analysis: C | Internal analysis (wtppm): Fe | Internal analysis: Si | Internal analysis: C | Weight loss (%) | Evaluation |
|---|---|---|---|---|---|---|---|---|---|---|---|---|---|
| Example 1 | Au | 99.99 | Water cooled crucible | 300° C. | 500° C. | <1 | <1 | <1 | <1 | <1 | <10 | <0.01 | ◎ |
| Comparative Example 1 | Au | 99.99 | Carbon crucible | None | None | 15 | 17 | 21 | 18 | 12 | 30 | 0.2 | Δ |
| Example 2 | Pt | 99.95 | Water cooled crucible | 900° C. | 800° C. | 4 | 2 | 6 | 3 | 2 | <10 | 0.02 | ○ |
| Comparative Example 2 | Pt | 99.95 | Ceramic crucible | None | None | 26 | 24 | 20 | 15 | 20 | 20 | 1.5 | X |
| Example 3 | Pd | 99.9 | Water cooled crucible | 1000° C. | 600° C. | 9 | 7 | 10 | 5 | 8 | 10 | 0.09 | ○ |
| Comparative Example 3 | Pd | 99.9 | Ceramic crucible | None | None | 18 | 38 | 30 | 30 | 45 | 20 | 2.7 | X |
| Example 4 | Ag | 99.99 | Water cooled crucible | 500° C. | 300° C. | 1 | <1 | 4 | <1 | <1 | <10 | <0.01 | ◎ |
| Comparative Example 4 | Ag | 99.99 | Carbon crucible | None | None | 37 | 20 | 40 | 12 | 15 | 50 | 0.5 | Δ |

INDUSTRIAL APPLICABILITY

According to the present disclosure, the bumping phenomenon can be effectively suppressed when melting a noble metal vapor deposition material. Consequently, the reduction of particles that adhere to the substrate can be expected, and this can contribute to the improvement in the product yield. The noble metal vapor deposition material of the present disclosure is useful for the formation of elements in electronic components, semiconductor devices, optical thin films, magnetic devices, LEDs, organic ELs, and LCDs.

The invention claimed is:

1. A rod-shaped vapor deposition material pellet composed of gold, wherein, when a surface area of 50 μm×50 μm of the vapor deposition material pellet is analyzed using energy dispersive X-ray spectroscopy, Fe is less than 10 wt %, Si is less than 10 wt %, and C is less than 10 wt %, and when analysis is performed using ICP atomic emission spectroscopy, Fe is less than 1 wtppm, and Si is less than 1 wtppm, and when analysis is performed using non-dispersive infrared, C is less than 10 wtppm.

* * * * *